United States Patent

Nakasuji et al.

Patent Number: 6,087,667
Date of Patent: *Jul. 11, 2000

[54] CHARGED-PARTICLE-BEAM (CPB) LITHOGRAPHY APPARATUS, EVALUATION METHOD, AND CPB SOURCE

[75] Inventors: Mamoru Nakasuji, Yokohama; Shintaro Kawata, Ibaraki-ken, both of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/940,638

[22] Filed: Sep. 30, 1997

[30] Foreign Application Priority Data

Oct. 1, 1996 [JP] Japan .................................. 8-260562

[51] Int. Cl.[7] .............................. H01J 37/30; H01J 37/06
[52] U.S. Cl. ........................................................ 250/492.2
[58] Field of Search ...................... 250/492.2; 313/346 R

[56] References Cited

U.S. PATENT DOCUMENTS

| | | | |
|---|---|---|---|
| 4,247,801 | 1/1981 | Dallos et al. | 315/107 |
| 4,468,586 | 8/1984 | Hohn | 313/346 R |
| 5,633,507 | 5/1997 | Pfeiffer et al. | 313/346 R |

FOREIGN PATENT DOCUMENTS 1 218 070   12/1969   United Kingdom .

OTHER PUBLICATIONS

Essig et al., "Critical Koehler Illumination for Shaped Beam Lithography," *J. Vac. Sci. Technol.* 4:83–85 (1986).

Telecommunication Technology Handbook, p. 471, published by Maruzenn (1957) (in the Japanese language, with partial English translation attached).

Takagawa et al., "Emission Characteristics of Single–Crystal $LaB_6$ Electron Gun," *J. Appl. Phys.* 53:5891–5897 (1982).

Yamauchi et al., "Work function of LaB6", Applied Physics Letters, vol. 29, No. 10, pp. 638–640, Nov. 1976.

*Primary Examiner*—Jack Berman
*Attorney, Agent, or Firm*—Klarquist Sparkman Campbell Leigh & Whinston, LLP

[57] ABSTRACT

Charged-particle-beam (CPB) lithography apparatus are disclosed that provide high accuracy in forming, by projection exposure using a charged particle beam, a pattern on a sensitive substrate at high throughput. The apparatus comprise a cathode having a work function of 2.65 eV or less within a space-charge limitation region. The temperature of the cathode is controlled within a range of 1,200 to 1,400° C.

38 Claims, 1 Drawing Sheet

CHARGED-PARTICLE-BEAM (CPB) LITHOGRAPHY APPARATUS, EVALUATION METHOD, AND CPB SOURCE

FIELD OF THE INVENTION

The invention pertains to charged-particle-beam lithography apparatus that form a minute pattern on a sensitive substrate. The invention also pertains to cathodes used in such apparatus for providing the charged-particle beam.

BACKGROUND OF THE INVENTION

Charged-particle-beam (e.g., electron-beam) lithography apparatus have utility for producing feature sizes of 0.2 µm or less on a sensitive substrate as used in, e.g., making semiconductor devices and displays. Conventionally, when forming such patterns on the sensitive substrate using a charged-particle-beam (e.g., electron-beam) lithography apparatus, pattern formation is performed using a large exposure dose of 16 $\mu c/Cm^2$ or higher to prevent dimensional non-uniformities resulting from electron emission shot noise.

Problems can arise when forming a pattern with such a large dose. Problems include: (1) reduced throughput; (2) heating of the substrate (e.g., wafer) by incident charged particles (e.g., electrons) causing a deterioration of registration and alignment between, e.g., adjoining projection regions; and (3) heating of the resist, making it impossible to form an accurate pattern on the substrate.

SUMMARY OF THE INVENTION

In view of the foregoing, a first object of the invention is to provide charged-particle-beam (CPB) lithography apparatus capable of forming a pattern having very small feature sizes on a sensitive substrate with high accuracy and with high throughput. A second object is to provide improved CPB sources for such apparatus. A third object is to provide methods for evaluating such apparatus. A fourth object is to provide methods for forming minute patterns employing such apparatus.

To such ends, the present invention provides, inter alia, a CPB lithography apparatus that comprises a CPB source. The CPB source comprises a cathode having a work function of 2.65 eV or less. The cathode is maintained within a space-charge limitation region by controlling its temperature within a range of 1,200 to 1,400 degrees C. Such conditions ensure low noise and highly accurate pattern transfer at sufficiently high throughput.

According to another aspect of the invention, CPB lithography apparatus are provided that comprise a cathode having a CPB emission plane of 1 mm or more in diameter and having a specular surface. The cathode is operated within a space-charge limitation region.

The foregoing apparatus can further comprise a control-anode electrode or anode that draws charged particles from the CPB emission plane and sets the ratio of fluctuation of the electric potential of the control-anode electrode or anode with respect to the electric potential of the cathode to $10^{-4}$ or less.

According to another aspect of the invention, methods are provided for evaluating CPB lithography apparatus. In the methods, a charged particle beam is projected onto a sensitive substrate through a test pattern (test reticle) comprising a regular array of shapes spaced apart from one another by a dimension no greater than a critical dimension of an actual pattern to be projected using the CPB apparatus (e.g., square "dots" each measuring 0.2 µm square or smaller and spaced apart by 0.2 µm, or lines measuring 10 µm×0.1 µm and spaced apart by 0.2 µm). The substrate is subsequently developed and the uniformity of the CPB projection performed by the apparatus is evaluated based on dimensional non-uniformity in the test pattern formed on the substrate.

According to another aspect of the invention, a pattern-formation method is provided in which a pattern having critical dimensions of 0.2 µm or less is formed by a CPB dose between 2 $\mu c/Cm^2$ and 15 $\mu c/cm^2$ using a CPB lithography apparatus as summarized above. During formation of a critical-layer pattern, a CPB dose is administered that is at least two times the dose used during non-critical layer formation. During formation of a contact-hole layer pattern (as an example of a "critical-layer" pattern), a CPB dose is administered that is at least four times the dose used during non-critical layer formation.

The method summarized above is used to evaluate the uniformity of a projected pattern image having critical dimensions. In the prior art, such evaluations were performed indirectly; i.e., factors having an apparent influence on the uniformity of the pattern were evaluated indirectly (e.g., by measuring illumination uniformity at the reticle or by measuring beam-current stability). The present method provides a way to perform such measurements directly, thereby providing a more precise evaluation.

The foregoing and additional features and advantages of the invention will be more readily apparent from the following detailed description which proceeds with reference to the accompanying drawings.

DETAILED DESCRIPTION

Figure 1:
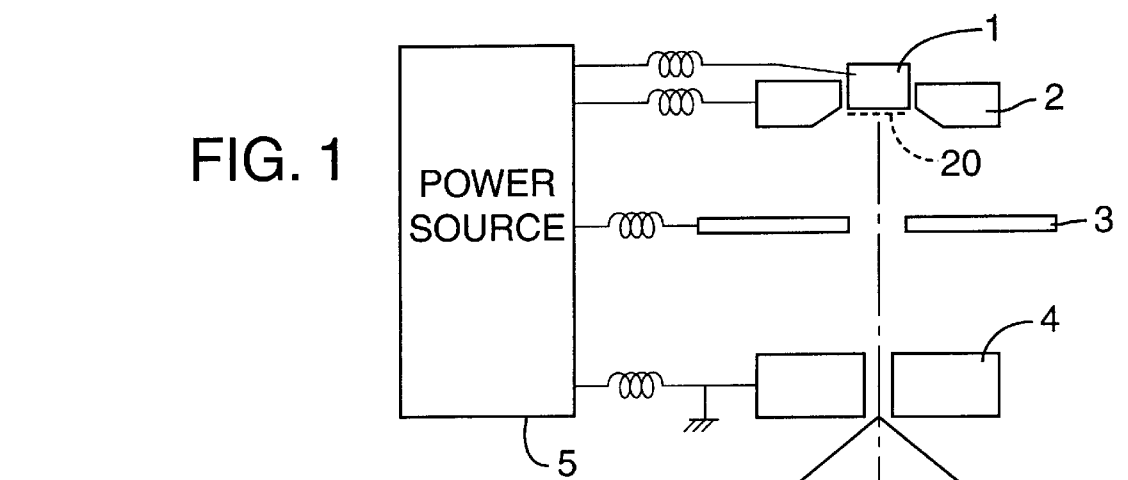
FIG. 1 is an elevational schematic illustration of a charged-particle-beam (CPB) lithography apparatus according to a preferred embodiment of the invention.

A preferred embodiment of an apparatus according to the invention is shown in FIG. 1. The apparatus comprises a cathode 1 that emits, e.g., a stream of electrons and thus serves as a charged-particle-beam (CPB) source. The stream of electrons passes through a "CPB optical system" preferably comprising a Wehnelt electrode 2, a control-anode electrode 3, and an anode 4 typically having a ground potential. A power supply 5 is connected to the cathode 1, the Wehnelt electrode 2, the control-anode electrode 3, and the anode 4. The brightness of the stream of electrons can be controlled by varying the electric potential of the Wehnelt electrode 2 and the control-anode electrode 3. By way of example, with the anode 4 at a ground potential (0 V) during operation, the cathode 1 can have an electric potential of approximately −100 kV and the Wehnelt electrode 2 can have an electric potential of approximately 1 to 100 V lower (i.e., more negative) than the potential applied to the cathode 1.

The CPB optical system also preferably comprises condenser lenses 6, 7, 8, a reticle 9, and lenses 10, 11. The lenses 10, 11 form a lens system that satisfies symmetrical magnetic-doublet conditions. Thus, a reduced image of the reticle 9 can be formed on a wafer 12 without distortion.

Figure 2:
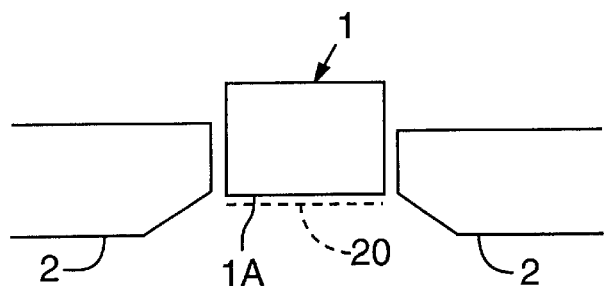
FIG. 2 is a enlarged view of the apparatus of FIG. 1 in the vicinity of the cathode.

An enlarged view of the cathode 1 is shown in FIG. 2. The cathode 1 is preferably made from monocrystalline $LaB_6$ having a <310> orientation at the electron-emission plane 1A. The electron-emission plane 1A is preferably 1 mm or more in diameter and has a specular surface. The work function of the electron-emission plane 1A is preferably approximately 2.4 eV.

The specular surface of the electron-emission plane 1A is achieved by polishing. With respect to the specular surface, surface roughness is preferably equal to or less than half the wavelength, i.e., roughness is preferably $\leq \lambda/2$, wherein $\lambda$ is about 0.6 $\mu$m.

In order to provide a low-noise CPB source (especially such an electron-beam source), the following conditions are preferably satisfied:

(1) The lower the cathode temperature, the less noise produced. For example, when the cathode is made from monocrystalline $LaB_6$, a temperature between 1,200 degrees and 1,400 degrees C is acceptable.

(2) The lower the work function of the cathode surface, the greater the cathode's capability of emitting a sufficient electron beam at low temperatures. This results in low noise. Preferably, the work function of the electron-emission plane 1A is approximately 2.4 eV, which is considered a representative "low" value. The work function of the monocrystalline $LaB_6$ cathode varies according to the crystal-plane orientation; the work function can be as low as 2.4 eV with a <310> plane or a <100> plane, for example, or as high as 2.65 eV with a <111> plane. With polycrystalline $LaB_6$, the work function has a value of approximately 2.7 eV. Experimentally, it has been shown that a CPB source according to the invention comprising a monocrystalline $LaB_6$ cathode exhibits low noise, whereas a CPB source comprising a polycrystalline $LaB_6$ cathode generally exhibits high noise.

(3) The operating conditions of the CPB source can be classified into the following categories: (a) temperature-limited conditions, (b) space-charge limitation conditions, and (c) conditions pertaining to the transition region. Condition (a) is important because electrons that exceed the Fermi level are generated randomly at higher levels as a function of increasing temperature, and generated noise is higher under higher temperature. With respect to condition (b), the cathode can emit a sufficiently large number of electrons, but electron current is limited by the electric field in the vicinity of the cathode. As a result, statistical limits are not easily reached, and noise is lower. For this reason, a region (space-charge limitation region) in which space-charge limitation conditions prevail is preferably used in the CPB lithography apparatus according to the invention. Transition-region conditions as noted in (c) are intermediate to the temperature-limitation conditions and space-charge-limitation conditions with respect to noise generation.

Thus, the CPB source preferably includes a space-charge limitation region. When such a CPB source is used with a space-charge limitation region, as shown in FIG. 2, a virtual cathode 20 is formed in the vicinity of the electron-emission plane 1A. As a result, the equivalent of an electron beam is emitted from the virtual cathode 20 at an initial speed of 0 (zero). In such a case, the virtual cathode 20 is defined by the structural dimensions of the respective electrodes of the CPB source and the voltage applied to each of them, so it is relatively easy to keep any positional fluctuation of the virtual cathode small, thereby reducing the noise produced by the CPB source. With such a configuration, when the cathode temperature is set to 1,280° C. or more, the virtual cathode 20 is stably formed at a position separated by 0.3 mm from the electron-emission plane 1A of the cathode.

When the area of the electron-emission plane 1A is relatively large, the electron-emission volume is averaged over time, resulting in reduced noise. Also, whenever there is unevenness in the electron-emission plane 1A, loci that emit electrons are concentrated into specific regions, which effectively reduces the area of the electron-emission plane 1A, and correspondingly reduces noise with increased smoothness of the electron-emission plane 1A.

As noted above, increasing the smoothness of the electron-emission plane 1A reduces noise. The electron-emission plane 1A is formed smooth by polishing to provide a specular surface of the electron-emission plane 1A.

In addition, any fluctuation of the voltage of the power source 5 is preferably kept as low as possible. The coefficient of voltage fluctuation of the Wehnelt electrode 2 and the control-anode electrode 3 with respect to the anode 4 (ground potential) is preferably $10^{-4}$ or less. For this reason, fluctuation of CPB-source current is small, and noise is also reduced.

With respect to an electron-emission plane diameter and power-source voltage fluctuation as described above, a pattern having a feature size of 0.2 $\mu$m or less can be projection-exposed within an acceptable dimensional tolerance onto a sensitive substrate. More specifically, such a pattern can be projection-exposed using an electron dose of, for example, 3 $\mu c/Cm^2$ for layers having non-critical features, 6 $\mu c/Cm^2$ or more (i.e., at least two times the dose used for non-critical layers) for layers having critical features requiring substantial relative dimensional accuracy, and 12 $\mu c/Cm^2$ to 15 $\mu c/Cm^2$ (approximately four times the dose used for non-critical layers) for contact-hole layers requiring the greatest dimensional accuracy. Thus, by varying the dose according to the feature sizes on the pattern, so as to minimize errors exceeding specified tolerances, it is possible to limit the occurrence of defects while maintaining high throughput overall.

As referred to herein, a "critical layer" is generally regarded as a layer requiring a relatively large dose to ensure that the pattern transferred to the substrate to form the critical layer meets specifications. An example of a critical layer is a layer defining contact holes and/or through holes of the resulting device. Layers requiring less dose than critical layers include layers defining active elements such as gates, drains, and sources of transistors. Layers requiring even lower doses include layers defining lead lines and/or bonding pads.

Throughput is increased due to the decreased doses (specifically, decreased exposure time) that can be provided when making non-critical layers. When forming a layer including contact holes (i.e., a critical layer), the filling factor (ratio of beam-transmissible area to entire exposure area) is relatively small (about 0.2 to 0.1); hence, a beam of large current density (J) can be used without any Coulomb effect on image quality. As a result, the dwell time (dose/J) can be small even if the actual dose is large. This allows throughput to be increased.

Figure 3:
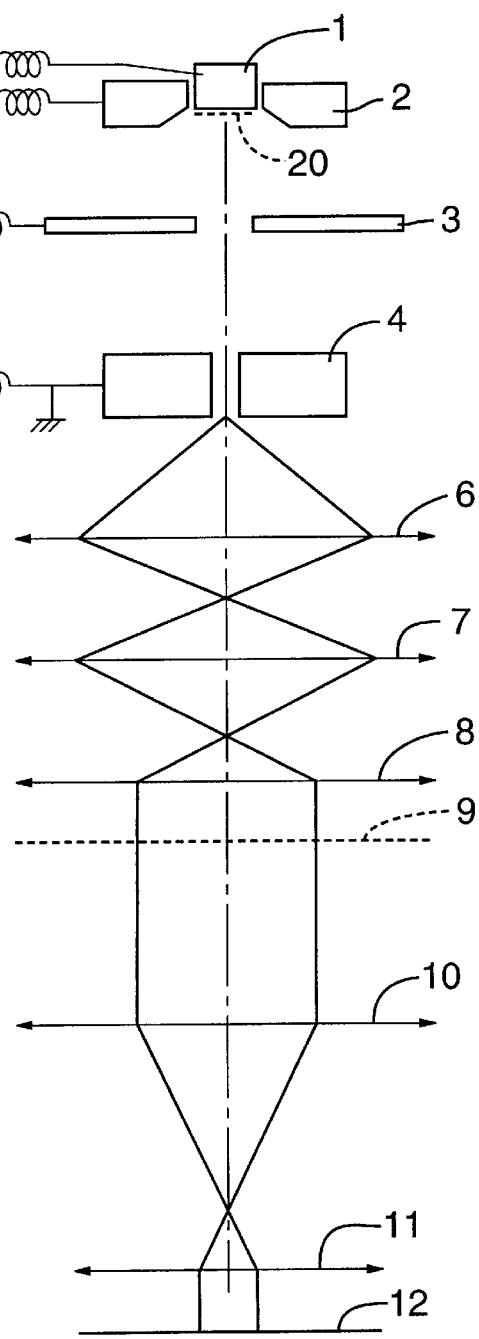
FIG. 3 shows a representative test pattern as used for evaluating a CPB lithography apparatus according to a preferred embodiment of a method according to the invention.
Figure 3:
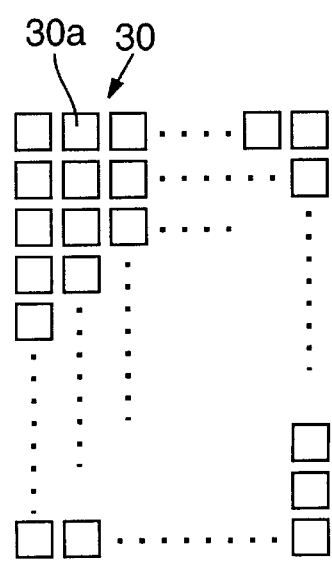

To evaluate whether or not the performance required to produce critical features of 0.2 $\mu$m or less is being maintained, a test pattern can be used as shown, for example, in FIG. 3. The test pattern 30 shown in FIG. 3 comprises an array of a large number (e.g., four-hundred) of identical squares 30a each 0.2 $\mu$m on each side. The squares 30a are arrayed with twenty squares in each orthogonal direction. The squares are separated from each other by a gap preferably equal to the minimum required linewidth of the pattern (e.g., 0.2 μm). The test pattern 30 can have a negative or positive pattern of squares 30a. After exposure, the dimensional accuracy of the respective squares 30a as formed on a sensitive substrate readily can be determined. Such a test exposure can be performed, for example, once a month. If the dimensional accuracy of the projected pattern does not meet specification, remedial action such as replacing the cathode 1 can be taken.

Whereas the test pattern shown in FIG. 3 is exemplary only, other test patterns can alternatively be used. A representative alternative test pattern can comprise a regular array of multiple rectangular shapes each measuring 0.1 μm in the X direction and 10 μm in the Y direction, or 10 μm in the X direction and 0.1 μm in the Y direction. The shapes are spaced apart from each other by a distance less than or equal to the critical dimension in the actual pattern to be projected using the CPB apparatus.

In general, decreases in the dimensional accuracy of a projected pattern arise from increases in the noise (time fluctuation) of the electron gun. Increased noise is generally caused by deteriorations of the electron-emission plane 1A of the cathode 1. Thus, a determination that the cathode 1 should be replaced can be made whenever the dimensional accuracy of the pattern drops a certain amount; and high accuracy can be continually maintained by regularly replacing the cathode 1.

In general, shot noise in a CPB lithography apparatus arises from changes in the CPB source. But, according to the present invention, a low-noise CPB source (e.g., electron gun) is obtained, especially for sufficient accuracy in producing feature sizes of 0.2 μm or less, by configuring the CPB source to produce a dose between 2 μc/Cm$^2$ and 15 μc/Cm$^2$. This ensures highly accurate pattern formation at high throughput.

Whereas the invention has been described in connection with preferred embodiments, it will by understood that the invention is not limited to those embodiments. On the contrary, the invention is intended to encompass all alternatives, modifications, and equivalents as may be included within the spirit and scope of the invention as defined by the appended claims.

What is claimed is:

1. A charged-particle-beam source for use in charged-particle-beam projection lithography, comprising:
   (a) a cathode configured to produce a charged particle beam having a cathode current, the cathode maintained at a cathode voltage;
   (b) an anode and a control-anode maintained at an anode voltage and control-anode voltage, respectively; and
   (c) a power supply configured to maintain the cathode voltage, the anode voltage, and the control-anode voltage and to adjust at least one of the cathode current, the cathode voltage, and the control-anode voltage to produce a space-charge limitation region between the cathode and the control-anode.

2. The charged-particle-beam source of claim 1, wherein the cathode comprises a charged-particle-emission plane, and the power supply is configured to produce, when the cathode is producing the charged particle beam, a virtual cathode adjacently downstream of the charged-particle-emission plane.

3. The charged-particle-beam source of claim 2, wherein the power supply is configured to produce the virtual cathode at a voltage minimum between the cathode and the control-anode.

4. The apparatus of claim 2, wherein the power supply is configured to produce the virtual cathode at a voltage minimum between the cathode and the control-anode.

5. The charged-particle-beam source of claim 1, further comprising a Wehnelt electrode, maintained at a Wehnelt voltage and that draws charged particles from the charged-particle-emission plane, wherein the power supply is configured to vary the cathode current by changing the respective voltages of at least one of the Wehnelt electrode and the control-anode.

6. The charged-particle-beam source of claim 1, wherein the charged particles have a negative charge, and the power supply maintains the control-anode voltage and the anode voltage at respective voltages greater than the cathode voltage, and the power supply produces a voltage minimum between the cathode and the control-anode.

7. The charged-particle-beam source of claim 6, wherein the cathode is a thermionic cathode and the power supply is configured to regulate the control-anode voltage.

8. The charged-particle-beam source of claim 1, wherein the charged particles have a positive charge, and the power supply maintains the control-anode voltage and the anode voltage at respective voltages that are less than the cathode voltage, and the power supply produces a voltage maximum between the cathode and the control-anode.

9. The charged-particle-beam source of claim 8, wherein the cathode is a thermionic cathode, and the power supply is configured to regulate the control-anode voltage.

10. A charged-particle-beam lithography apparatus, comprising:
    (a) a charged-particle-beam source that produces a beam of charged particles having a cathode current, the charged-particle-beam source comprising a charged-particle-emission plane;
    (b) at least two condenser lenses;
    (c) a charged-particle-beam optical system configured to direct the beam of charged particles from the source through the condenser lenses and a reticle and from the reticle to a sensitive substrate;
    (d) the charged-particle-beam source comprising an anode, a control-anode, and a cathode that produces the cathode current;
    (e) a power supply that maintains the cathode, anode, and the control-anode at a cathode voltage, an anode voltage, and a control-anode voltage, respectively, wherein the power supply is configured to control at least one of the cathode current, the cathode voltage, and the control-anode voltage to produce a space-charge limitation region between the cathode and the control-anode when the cathode is energized to produce the charged particle beam; and
    (f) a symmetric magnetic doublet lens system situated between the reticle and the substrate, the symmetric magnetic doublet lens system being configured to produce a reduced image of the reticle on the substrate.

11. The apparatus of claim 10, wherein the cathode is configured to produce a virtual cathode adjacently downstream of the charged-particle-emission plane.

12. The apparatus of claim 10, wherein the charged-particle-beam optical system comprises a Wehnelt electrode that is maintained at a voltage such that the Wehnelt electrode draws charged particles from the charged-particle-emission plane, wherein the power supply is configured to vary the cathode current by varying a respective voltage of at least one of the Wehnelt electrode and the control-anode.

13. The apparatus of claim 10, wherein the cathode is a thermionic cathode, and the power supply is configured to regulate the control-anode voltage.

14. The apparatus of claim 10, wherein the charged particles have a negative charge, and the control-anode voltage and the anode voltage are greater than the cathode voltage, and the power supply produces a voltage minimum between the cathode and the control-anode.

15. The apparatus of claim 14, wherein the cathode is a thermionic cathode, and the power supply is configured to regulate the control-anode voltage.

16. The apparatus of claim 10, wherein the charged particles have a positive charge, the control-anode voltage and the anode voltage are smaller than the cathode voltage, and the power supply produces a voltage maximum between the cathode and the control-anode.

17. The charged-particle-beam source of claim 16, wherein the cathode is a thermionic cathode, and the power supply is configured to regulate the control-anode voltage.

18. The charged-particle-beam source of claim 10, wherein the cathode is a thermionic cathode, and the power supply is configured to regulate the control-anode voltage.

19. A charged-particle-beam lithography apparatus, comprising:
 (a) a charged-particle-beam source configured to produce a beam of charged particles, the charged-particle-beam source comprising a cathode with a charged-particle-emission plane;
 (b) a charged-particle-beam optical system comprising at least two condenser lenses and configured to direct the beam of charged particles from the source through the condenser lenses and then a reticle and from the reticle to a sensitive substrate;
 (c) an anode and a control-anode electrode, the control-anode electrode being configured to be charged with an electrode potential having a ratio of electric-potential fluctuation with respect to the cathode of no greater than $10^{-4}$;
 (d) the charged-particle-beam optical system further comprises a symmetric magnetic doublet lens system configured to form a reduced image of the reticle on the substrate; and
 (e) a power supply configured to control a brightness of the charged-particle-beam by establishing a space-charge limitation region between the cathode and the control-anode electrode and by varying the control-anode electrode potential.

20. The apparatus of claim 19, wherein the power supply is configured to vary a dose delivered onto the sensitive substrate over a range of at least 2:1 by a change of voltage of the control-anode.

21. The apparatus of claim 19, wherein the power supply is configured to control the electrode potential of the control-anode electrode so as to vary a dose delivered onto the sensitive substrate by a range of 4:1.

22. The apparatus of claim 19, wherein the power supply is configured to vary at least one of the cathode voltage, the control-anode voltage, and the cathode current to produce a virtual cathode adjacently downstream of the charged-particle-emission plane.

23. The apparatus of claim 22, wherein the power supply is configured to produce a virtual cathode between the cathode and the control-anode electrode.

24. A method of controlling a charged-particle-beam source, comprising:
 providing a cathode that emits a charged-particle beam having a beam current;
 providing an anode and a control-anode;
 maintaining the cathode at a cathode voltage;
 maintaining the anode at an anode voltage and the control-anode at a control-anode voltage; and
 adjusting at least one of the cathode current, the cathode voltage, and the control-anode voltage to produce a space-charge limitation region between the cathode and the control-anode.

25. The method of claim 24, further comprising forming a virtual cathode at a location of the space-charge limitation region.

26. The method of claim 24, wherein the charge particles have a negative charge, the method further comprising:
 maintaining the anode voltage and the control-anode voltage at voltages that are greater than the cathode voltage; and
 adjusting at least one of the cathode current, the cathode voltage, and the control-anode voltage to produce a voltage minimum between the cathode and the control-anode.

27. The method of claim 24, wherein the charge particles have a positive charge, the method further comprising:
 maintaining the anode voltage and the control-anode voltage at voltages that are less than the cathode voltage; and
 adjusting at least one of the cathode current, the cathode voltage, and the control-anode voltage to produce a voltage minimum between the cathode and the control-anode.

28. The method of claim 24 wherein the cathode includes a charged-particle emission plane, the method further comprising:
 providing a Wehnelt electrode; and
 maintaining the Wehnelt electrode at a Wehnelt voltage that draws charged particles from the charged-particle emission plane.

29. The method of claim 24, wherein the control-anode voltage has a ratio of voltage fluctuation with respect to the cathode voltage of less than about $10^{-4}$.

30. A method of controlling a charged-particle-beam source comprising a cathode, an anode, and a control-anode, the method comprising:
 (a) producing a cathode current with a charged-particle-beam source that produces a beam of charged particles, the charged-particle-beam source comprising a charged-particle-emission plane;
 (b) providing at least two condenser lenses;
 (c) providing a charged-particle-beam optical system configured to direct the beam of charged particles from the source through the condenser lenses and a reticle and from the reticle to a sensitive substrate;
 (d) maintaining the cathode, the anode, and the control-anode at a cathode voltage, an anode voltage, and a control-anode voltage, respectively;
 (e) selecting the cathode current and at least one of the cathode voltage, the anode voltage, and the control-anode voltage to produce a space-charge limitation region between the cathode and the control-anode when the cathode is energized to produce the charged particle beam; and
 (f) producing a reduced image of the reticle on the substrate.

31. The method of claim 30, further comprising:
 providing a symmetric magnetic doublet lens system situated between the reticle and the substrate; and
 producing a reduced image of the reticle with the symmetric magnetic doublet lens system.

32. The method of claim 30, further comprising forming a virtual cathode at the position of the space-charge limitation region.

33. The method of claim 30, wherein the charged particles have a negative charge, the method further comprising:

maintaining the anode voltage and the control-anode voltage at respective voltages greater than the cathode voltage; and adjusting at least one of the cathode current, the cathode voltage, and the control-anode voltage to produce a voltage minimum between the cathode and the control-anode.

34. The method of claim 30, further comprising:

providing a Wehnelt electrode and maintaining the Wehnelt electrode at a voltage such that the Wehnelt electrode draws charged particles from the charged-particle-emission plane; and controlling the cathode current by varying a respective voltage of at least one of the Wehnelt electrode and the control anode.

35. The method of claim 30, further comprising regulating at least one of the cathode voltage, the control-anode voltage, and the cathode current to produce a virtual cathode adjacently downstream of the charged-particle-emission plane.

36. A method of exposing a sensitive substrate with a charged-particle beam, the method comprising:

(a) providing a charged-particle-beam source comprising a cathode, an anode, a control-anode, and a charged-particle-emission plane;

(b) producing a cathode current with a charged-particle-beam source;

(c) providing at least two condenser lenses;

(d) providing a charged-particle-beam optical system configured to direct the beam of charged particles from the source through the condenser lenses and a reticle and from the reticle to the sensitive substrate;

(f) maintaining the cathode, the anode, and the control-anode at a cathode voltage, an anode voltage, and a control-anode voltage, respectively;

(g) selecting the cathode current and at least one of the cathode voltage, the anode voltage, and the control-anode voltage to produce a space-charge limitation region between the cathode and the control-anode when the cathode is energized to produce the charged particle beam; and (h) producing a reduced image of the reticle on the substrate.

37. The method of claim 36, further comprising exposing a contact-hole layer onto the sensitive substrate at a dose that is at least four times a dose used to expose a non-critical layer onto the sensitive substrate, wherein the dose is regulated by adjustment of the control-anode voltage.

38. The method of claim 36, further comprising exposing a pattern of a critical layer onto the sensitive substrate at a dose that is at least two times a dose used to expose a pattern of a non-critical layer onto the sensitive substrate.

* * * * *

UNITED STATES PATENT AND TRADEMARK OFFICE
CERTIFICATE OF CORRECTION

PATENT NO. : 6,087,667
DATED : July 11, 2000
INVENTOR(S) : Nakasuji et al.

It is certified that error appears in the above-identified patent and that said Letters Patent is hereby corrected as shown below:

Column 1,
Line 20, "16 µc/Cm$^2$" should read -- 16 µC/cm$^2$ --.

Column 2,
Line 10, "2 µc/Cm$^2$" should read -- 2 µC/cm$^2$ --.

Column 4,
Line 28, "3 µc/Cm$^2$" should read -- 3 µC/cm$^2$ --.
Line 28, "6 µc/Cm$^2$" should read -- 6 µC/cm$^2$ --.
Line 32, "12 µc/Cm$^2$" should read -- 12 µC/cm$^2$ --.
Line 33, "µc/Cm$^2$" should read -- µC/cm$^2$ --.

Column 5,
Line 34, "2 µc/Cm$^2$" should read -- 2 µC/cm$^2$ --.
Line 35, "µc/Cm$^2$" should read -- µC/cm$^2$ --.

Signed and Sealed this

Twentieth Day of November, 2001

Attest:

NICHOLAS P. GODICI
Attesting Officer    Acting Director of the United States Patent and Trademark Office